United States Patent [19]

Nakamura

[11] Patent Number: 4,837,524

[45] Date of Patent: Jun. 6, 1989

[54] LOWER-NOISE MICROWAVE AMPLIFYING CIRCUIT

[75] Inventor: Makio Nakamura, Osaka, Japan

[73] Assignee: Sharp Kabushiki Kaisha, Osaka, Japan

[21] Appl. No.: 154,356

[22] Filed: Feb. 11, 1988

[30] Foreign Application Priority Data

Feb. 13, 1987 [JP] Japan .................................. 62-32112

[51] Int. Cl.[4] .............................................. H03F 3/60

[52] U.S. Cl. ...................................... 330/286; 333/26; 333/33; 333/263

[58] Field of Search ............................ 333/26, 33, 263; 330/286, 287

[56] References Cited

U.S. PATENT DOCUMENTS 3,638,148 1/1972 Hallford et al. .

3,796,976 3/1974 Heng et al. .

4,618,838 10/1986 Kajiwara et al. ..................... 333/33

4,679,249 7/1987 Tanake et al. .................... 333/26 X

FOREIGN PATENT DOCUMENTS 0154496 2/1985 European Pat. Off. .

*Primary Examiner*—Paul Gensler

*Attorney, Agent, or Firm*—Birch, Stewart, Kolasch & Birch

[57] ABSTRACT

A lower-noise microwave amplifying circuit for use in a lower-noise converter includes a metallic conductor for use in performance adjustment. The metallic conductor projects from the microstrip line and is provided near a bendable connecting portion between an input coaxial rod in a coaxial waveguide conversion portion and a microstrip line for constructing one portion of an amplifying circuit. Therefore, the lower-noise microwave amplification circuit is easily adjusted for improving the basic characteristics such as input VSWR or the like and is simpler in construction.

18 Claims, 3 Drawing Sheets

LOWER-NOISE MICROWAVE AMPLIFYING CIRCUIT

BACKGROUND OF THE INVENTION

The embodiments of the present invention relate to a lower-noise microwave amplifying circuit which is used for a lower-noise converter for satellite broadcast reception use. More particularly, a lower-noise microwave amplifying circuit is presented which is more easily adjusted than in the basic performance of input VSWR (i.e., voltage standing-wave-ratio) or the like and is simpler in construction.

A conventional microwave amplifying circuit for use in such a converter is generally constructed as shown in FIG. 5. FIG. 5 shows a top plan view of the top plan of the conventional converter having the essential portions in this example.

Referring to FIG. 5, in order to adjust the basic performance of the input VSWR or the like, island-shaped patterns 3, 3, . . . are provided near the connecting portion between the input coaxial rod of the coaxial waveguide conversion portion and the microstrip line 2 to connect them properly with the microstrip lines 2 through soldering or the like for the adjusting operation. A semiconductor circuit element 4 is composed of GaAs field effect type transistors (FET) or the like.

The island-shaped patterns 3, 3, . . . provided as described hereinabove have the following disadvantages:

(1) More time, and labor are required to make adjustments, because the respective island-shaped patterns 3, 3, . . . must be soldered in a connecting operation for the adjustment;

(2) A Solder removing operation is very difficult to perform when beginning from start;

(3) A risk is present for electrostatically breaking the semiconductor circuit element 4, such as GaAs FET, etc., in the adjustment;

(4) Fine adjustments are difficult to make, because island-shaped patterns 3, 3, . . . are restricted in size; and (5) Effects are produced when adjusting the input VSWR and also, influences to the noise figure, and the gain characteristics are produced which deetermine their respective characteristics.

SUMMARY OF THE INVENTION

Accordingly, an object of the embodiments in the present invention is to provide a lower-noise microwave amplifying circuit which is free from the above-described disadvantages of the conventional adjustment mechanism and is simpler in construction.

In accomplishing the object, according to one preferred embodiment of the present invention, a flexible metallic conductor for adjustment is used in the connecting portion between an input coaxial rod in the coaxial waveguide conversion portion and the microstrip line of the amplifying circuit. The flexible metallic conductor may be a linear rod member made of tin-plated line or the like which is approximately 0.5 mm in diameter and one fourth or less of the working frequency in length and fixedly soldered.

The metallic conductor is projected from the microstrip line near the connecting portion, is properly bent to fixedly retain the shape, and is provided near the connecting portion between the input coaxial rod of the coaxial waveguide conversion portion and a microstrip line which is one portion of the amplifying circuit. As a result the admittance in the connecting portion may be adjusted through the variation in the height (or the distance) from the microstrip line. The fine adjustment of the admittance may be readily effected by the bending degree.

The basic performance of the input VSWR or the like may be readily adjusted by the adjustment of the admittance from the bending of such a metallic conductor as described hereinabove.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENTS

Figure 1:
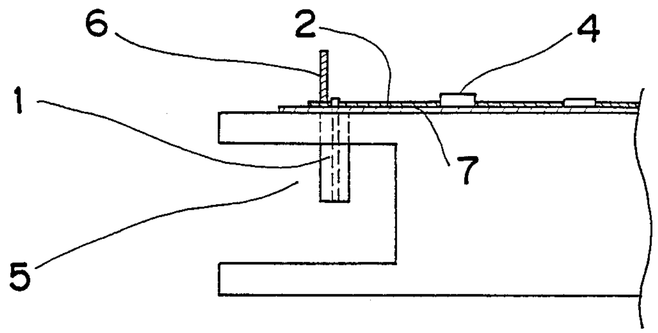
FIG. 1 is a side elevational view showing a coaxial waveguide converting portion of a microwave amplifying circuit in accordance with one embodiment of the present invention.

Before the description of the present invention proceeds, it is to be noted that like parts are designated by like reference numerals through the accompanying drawings.

(Embodiment)

Referring now to the drawings, there is shown in FIG. 1 through FIG. 4, one embodiment of the present invention.

Figure 2:
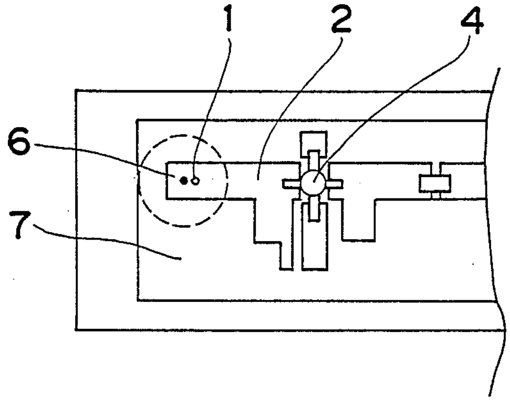
FIG. 2 is a top plan view of the top plane of the coaxial waveguide converting portion of FIG. 1.
Figure 3:
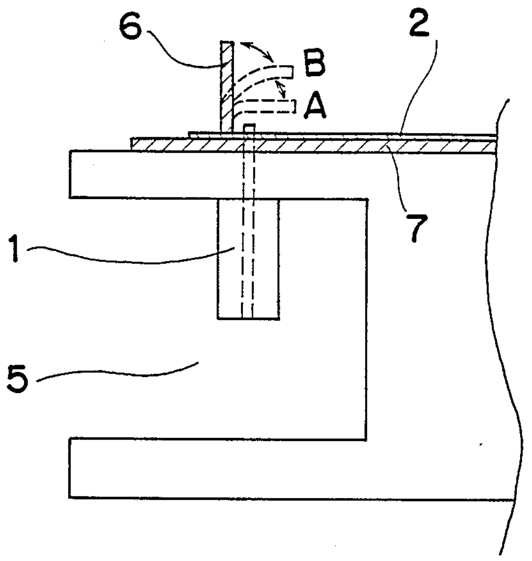
FIG. 3 is the side elevational view, on an enlarged scale, of the coaxial waveguide converting portion of FIG. 1.
Figure 5:
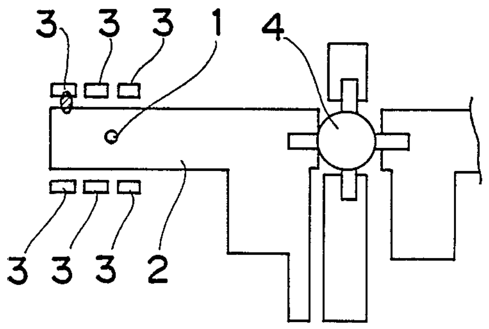
Fig.5 PRIOR ART
FIG. 5 is a top plan view of the top plane of the coaxial waveguide converting portion similar to FIG. 1, but showing the conventional example as already referred above.

FIG. 1 shows a side elevational view of the essential coaxial waveguide converting portion. FIG. 2 shows a top plan view of the top plane of the coaxial waveguide converting portion. FIG. 3 shows an enlarged side elevational view which illustrates the operation during the adjusting operation.

A flexible metallic conductor 6 is provided in a connecting portion between an input Teflon coaxial rod 1 in a coaxial waveguide converting portion 5 and a microstrip line 2 of the amplifying circuit. The connection is performed by a soldering operation of the metallic conductor 6 onto the microstrip line 2 simultaneously with a soldering operation of the input Teflon coaxial rod 1.

The metallic conductor 6 uses a linear material such as tin-plated line or the like, which has better soldering properties and is easier to bend and secure. The linear material is preferred to be approximately 0.5 mm thick in diameter and one fourth or less (approximately 4 mm or less when approximately 12 GHz of the working frequency is on the Teflon base plate 7) of the working frequency wavelength in length on the microstrip line, so as to prevent the resonance in the working frequency and its vicinity.

In order to effect the adjusting operation, the metallic conductor 6 secured to the connecting portion is bent downward or erected on the microstrip line 2 near the connecting portion.

Figure 4:
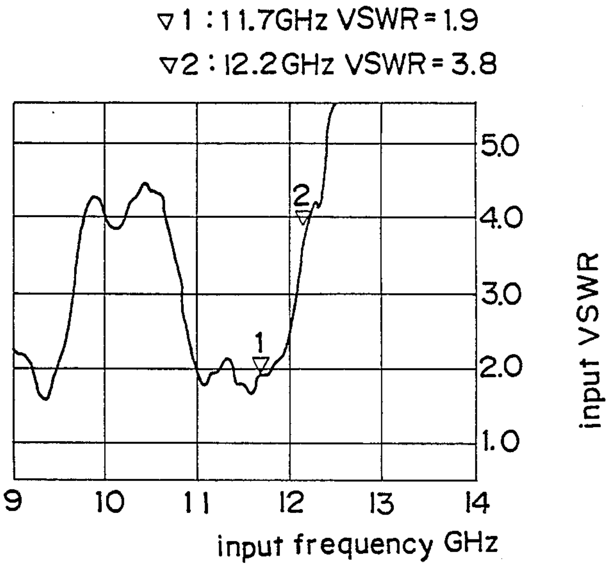
FIG. 4(A), (B) are characteristic graphs each showing the measured data example of the input VSWR by the adjustments A, B of FIG. 3.
Figure 4:
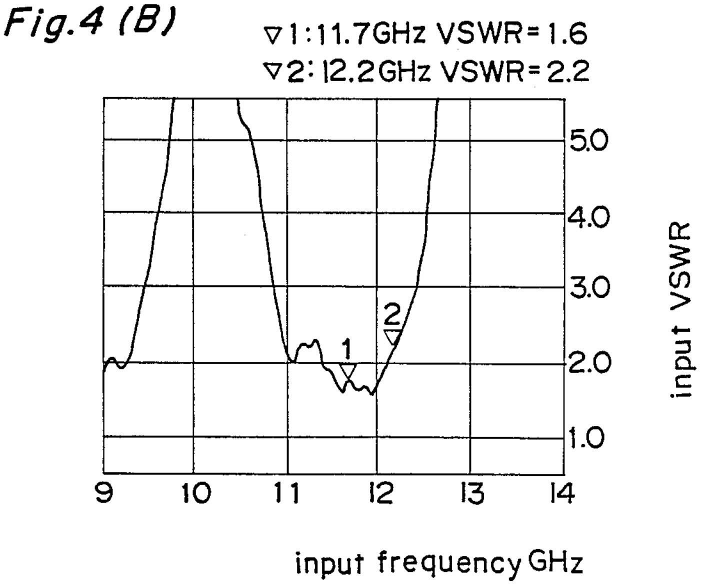

Assume that the metallic conductor 6 has been bent as shown by the reference characters A and B of FIG. 3. FIG. 4 (A) shows an example of measured data of the input VSWR when the metallic conductor has been bent as the reference character A shows, and FIG. 4 (B) shows an example of the measured data of the input VSWR when the metallic conductor has been bent as the reference character B shows. In FIG. 4 (A), the input VSWR is 1.9 when the input frequency is 11.7 GHz, and the input VSWR is 3.8 when the input frequency is 12.2 GHz. In FIG. 4 (B), the input VSWR is 1.6 when the input frequency is 11.7 GHz, and the input VSWR is 2.2 when the input frequency is 12.2 GHz.

As is apparent from the comparison between (A) and B) of FIG. 4, FIG. 4 (B) is preferable when the input VSWR is at a working frequency in the vicinity of 12 GHz. it has been found that the mtallic conductor 6 should be bent for an adjustment as shown by the reference character B of FIG. 3.

Also, as the case may be, the metallic conductor 6 may be cut with a nipper or the like for changing the length thereof. This is useful especially when a considerable adjustment is required.

The adjustment is easier to make, because the metallic conductor 6 may be bent or erected through the light pushing operation with a small insulated pincer, an adjusting rod or the like in the input VSWR adjustment. As the fine adjustment is easier to make, the adjustment may be made near an input VSWR value which is considered to be optimum, considering the relation with respect to the other basic characteristics (for example, noise figure).

The metallic conductor 6 is on the microstrip line 2 near the connecting portion and the height (or distance) from the microstrip line 2 is varied to make the adjustment. Therefore, an effect is given only to the admittance of the connecting portion between the input Teflon coaxial rod in the coaxial waveguide portion 5 and the microstrip line 2. Thus, less influence upon the pattern on the microstrip line 2 and less negative influences upon the other basic characteristics (for example, noise figure or gain) will result.

As there is no risk of electrostatically breaking a semiconductor circuit element 4 such as GaAs FET or the like or breaking the semi conductor circuit member 4 short-circuiting caused by the use of an insulated regulating rod or a pincer, the adjusting may be effected during the energizing operation.

In the above-described embodiment, a tin-plated line is used for the metallic conductor 6, which is not the only that may be used. Also, the rod shape is not necessarily linear, but may be made square or flat.

For example, a copper plate may be used though it is somewhat more expensive. In addition to the soldering method, various methods may be adopted to secure the metallic conductor 6. For the metallic conductor 6, the core material of the input Teflon coaxial rod 1 may be projected from the microstirp line 2. This may be properly bent to serve for the metallic conductor 6 in the present embodiment.

As is clear from the foregong description, according to the arrangement of the present embodiment, a lower-noise microwave amplifying circuit may be provided, which is simpler in construction, may be easily adjusted for the basic performance of the input VSWR or the like, and has a higher practical value.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A lower-noise microwave amplifying circuit for amplifying microwave signals from coaxial waveguide converting means comprising:

an input coaxial rod projecting through a hole on a surface of said coaxial waveguide converting means into a hollow portion within said coaxial waveguide converting means;

a microstrip line connected to said amplifying circuit and disposed on said surface of said coaxial waveguide converting means; and a bendable metallic conductor connected to said microstrip line and projected out from said surface away from said hollow portion of said coaxial waveguide converting means, said bendable metallic conductor being adjusted to an optimum angle for reducing noise of said microwave signals.

2. The lower-noise microwave amplifying circuit according to claim 1, wherein said input coaxial rod is fabricated from Teflon.

3. The lower-noise microwave amplifying circuit according to claim 1, wherein said bendable metallic conductor is of a flat shape.

4. The lower-noise microwave amplifying circuit according to claim 1, wherein said bendable metallic conductor is a copper plate.

5. The lower-noise microwave amplifying circuit according to claim 1, wherein said bendable metallic conductor is a tin plate line.

6. The lower-noise microwave amplifying circuit according to claim 5, wherein said bendable metallic conductor is of a square shape.

7. The lower-noise microwave amplifying circuit according to claim 5, wherein said tin plate line is of a rod shape.

8. The lower-noise microwave amplifying circuit according to claim 7, wherein said tin plate line has a diameter of 0.5 mm.

9. The lower-noise microwave amplifying circuit according to claim 7, wherein said tin plate line has a length of less than ¼ of a working frequency wavelength of said microwave signals.

10. A lower-noise microwave amplifying circuit for amplifying microwave signals from coaxial waveguide converting means comprising:

an input coaxial rod projecting through a hole on a surface of said coaxial waveguide converting means into a hollow portion within said coaxial waveguide converting means;

a microstrip line for connecting to said amplifying circuit with said input coaxial rod and disposed on said surface of said coaxial waveguide converting means; and a metallic conductor having a bendable connecting portion connected to said microstrip line and projected out from said surface of said coaxial waveguide converting means away from said hollow portion, said bendable connecting portion adjusted to an optimum angle for reducing noise of said microwave signals.

11. The lower-noise microwave amplifying circuit according to claim 10, wherein said input coaxial rod is fabricated from Teflon.

12. The lower-noise microwave amplifying circuit according to claim 10, wherein said metallic conductor is of a square shape.

13. The lower-noise microwave amplifying circuit according to claim 10 wherein said bendable metallic conductor is a copper plate.

14. The lower-noise microwave amplifying circuit according to claim 10, wherein said bendable metallic conductor is a tin plate line.

15. The lower-noise microwave amplifying circuit according to claim 14 wherein said tin plate line has a diameter of 0.5 mm.

16. The lower-noise microwave amplifying circuit according to claim 10, wherein said metallic conductor is of a rod shape.

17. The lower-noise microwave amplifying circuit according to claim 16, wherein said tin plate line is of a flat shape.

18. The lower-noise microwave amplifying circuit according to claim 16, wherein said tin plate line has a length of less than $\frac{1}{4}$ of a working frequency wavelength of said microwave signals.

* * * * *